(12) United States Patent
Sichmann et al.

(10) Patent No.: US 6,344,114 B1
(45) Date of Patent: **\*Feb. 5, 2002**

(54) MAGNETRON SPUTTERING CATHODE WITH MAGNET DISPOSED BETWEEN TWO YOKE PLATES

(75) Inventors: Eggo Sichmann, Gelnhausen; Michael Muecke, Karben; Wolfgang Becker, Schaatheim; Klaus Truckenmueller, Kleinheubach, all of (DE)

(73) Assignee: Singulus Technologies AG, Alzenau (DE)

(\*) Notice: Subject to any disclaimer, the term of this patent is extended or adjusted under 35 U.S.C. 154(b) by 0 days.

This patent is subject to a terminal disclaimer.

(21) Appl. No.: 09/331,453

(22) PCT Filed: Dec. 22, 1997

(86) PCT No.: PCT/EP97/07225

§ 371 Date: Aug. 30, 1999

§ 102(e) Date: Aug. 30, 1999

(87) PCT Pub. No.: WO98/28777

PCT Pub. Date: Jul. 2, 1998

(30) Foreign Application Priority Data

Dec. 21, 1996 (DE) .......................................... 196 54 007
Dec. 21, 1996 (DE) .......................................... 196 53 999
Dec. 21, 1996 (DE) .......................................... 196 54 000

(51) Int. Cl.$^7$ ............................................. C23C 14/34
(52) U.S. Cl. ........................... 204/192.12; 204/298.16; 204/298.19; 204/298.03; 204/192.13
(58) Field of Search ................... 204/192.12, 192.13, 204/298.03, 298.16, 298.17, 298.19, 298.2

(56) References Cited

U.S. PATENT DOCUMENTS

| 3,956,093 A | | 5/1976 | McLeod |
| 4,336,119 A | \* | 6/1982 | Gillery .................. 204/192.13 |
| 5,182,001 A | | 1/1993 | Fritsche et al. |
| 5,262,030 A | | 11/1993 | Potter |
| 5,415,754 A | \* | 5/1995 | Manley .................. 204/298.19 |
| 5,772,861 A | \* | 6/1998 | Meredith, Jr. et al. .. 204/298.03 |
| 5,861,088 A | \* | 1/1999 | Curtins .................. 204/298.19 |
| 5,863,399 A | \* | 1/1999 | Sichmann .............. 204/298.19 |

FOREIGN PATENT DOCUMENTS

| DE | 41 00 291 | 1/1991 |
| DE | 43 15 023 | 11/1994 |
| DE | 43 29 155 | 3/1995 |
| DE | 196 54 000 | 12/1996 |

\* cited by examiner

*Primary Examiner*—Rodney G. McDonald
*Assistant Examiner*—Gregg Cantelmo
(74) *Attorney, Agent, or Firm*—Pillsbury Winthrop LLP (57) ABSTRACT

A method of coating a substrate by magnetron cathode sputtering includes a sputtering cathode having pole shoes and being arranged in a vacuum chamber. A target and a magnetic field are provided in an area of the surface of the target and the magnetic field is varied stepwise and/or continuously to displace the plasma radially such that the erosion groove is likewise displaced radially. The variable magnetic field is generated by coils between the back surface of the target and a yoke plate while a static magnetic field is gernated by an annularly arranged magnet in the area of the yoke plate and a target space between the target and the substrate is shielded by means of an iron core which also increases the field strength of the variable magnetic field.

40 Claims, 12 Drawing Sheets

MAGNETRON SPUTTERING CATHODE WITH MAGNET DISPOSED BETWEEN TWO YOKE PLATES

This application is the national phase of international application PCT/EP97/07225 filed Dec. 22, 1997 which designated the U.S.

The present invention relates to a device and a method for magnetron cathode sputtering for producing coatings on a substrate by means of a sputtering cathode, which can be arranged in a vacuum chamber and preferably comprises, with respect to the center axis of the sputtering cathode, pole shoes, a target and at least one concentrically or annularly arranged magnet.

A device for cathode sputtering for the static coating of disk-shaped substrates by means of a plasma in a vacuum chamber with at least one opening, which can be closed from the outside by placing a sputtering cathode on it, is already known (DE 43 15 023 A1). An elastic vacuum seal ring and an annular anode are provided between the cathode and the chamber wall, which radially enclose the openings from the outside, wherein the anode has a flat contact surface on its surface facing the cathode. The known sputtering cathode consists of a disk-shaped ferromagnetic yoke and a cooling plate. A disk-shaped insulator is inserted between these two. The target to be sputtered is arranged in front of the cooling plate, while an annularly arranged magnet is inserted in a groove on the back of the cooling plate. A counter-magnetic field is generated by the annularly arranged magnet, which affects the path of the magnetic field lines. By means of this, the path of the magnetic field lines is given an approximately parallel or lens-shaped or convex form.

U.S. Pat. No. 5,262,030 discloses a magnetron sputtering cathode with a variable magnetic field during coating. The magnetic field determines that area of the target from which the material is ejected. For this purpose, an arrangement is provided which comprises several magnets which are arranged behind the sputtering cathode and can selectively be switched on and off for generating or not a magnetic field being parallel to the surface of the target. Overlapping causes the magnetic field to move radially outwardly or over specific areas of the target. Since predetermined magnetic fields are switched on or off, the magnetic field in the area of the target surface is varied discontinuously.

U.S. Pat. No. 3,956,093 relates to a method and a device for magnetron cathode sputtering comprising a sputtering cathode arranged in a vacuum chamber, pole shoes, a target and a magnetic field in the area of the target surface generated in that a variable magnetic field superimposes a static magnetic field. The variable magnetic field is generated by coils arranged in one plane with the target.

U.S. Pat. No. 5,182,001 discloses a method for coating substrates by magnetron cathode sputtering. The method provides a variable magnetic field in the area of the target surface generated by a coil in that a variable magnetic field overlaps a static magnetic field. The permanent magnets generating the static magnetic field have poles provided on the one hand outside the outer edge of the target and, on the other hand, inside the inner edge of the target. In the outer area of the permanent magnet at the outer edge of the target a magnetic coil for generating the variable magnetic field is provided, said magnetic coil extending vertically over the target surface.

It is an object of the present invention to provide an improved cathode sputtering device and an improved cathode sputtering method, wherein the target yield is improved and, at the same time, a very constant coating thickness is achieved.

This object is achieved by the features of the claims.

In order to be adapted to the shape of the substrate, the cathode, the target, the yoke and the magnet arrangement can take, for example, an annular, rectangular, elliptical or any other shape if the substrate has, for example, a circular, rectangular, elliptical or any other shape.

Preferably, at least one further means generating a continuously variable magnetic field is provided in the area of the target next to the magnets arranged in accordance with the shape of the substrate. Due to the advantageous arrangement of the magnet next to the means generating a variable magnetic field, a constant coating thickness is achieved even if the substrates have different sizes, wherein the coating thickness can deviate between ±2% to 3%. The sputtering groove is formed in accordance with the preset magnetic field. With this magnet arrangement in connection with the means generating a variable magnetic field, the main magnetic field is generated such that throughout the entire process the erosion groove can be influenced purposefully.

Due to the advantageous arrangement of the, for example, annularly arranged magnet, in connection with the means generating a variable magnetic field or with at least one coil, the magnetic field is continuously varied, in particular in the area of the target surface. In this connection, the magnetic flux lines extend from the center to outside or from outside to inside and take a lens-shaped course, so that an erosion groove being as large as possible is obtained. If a concave erosion groove is obtained after a considerably long process, it is advantageous that the magnetic field lines take a course being approximately parallel with respect to the surface of the target. A shielding plate prevents the magnetic field lines from entering the yoke. Advantageously, these coils can also be controlled in accordance with time so that it is possible to vary, on the one hand, the service life of the target and, on the other hand, the magnetic field during a cycle time. For example, a control curve ($f_{(t)}=I_{(t)}$) can be determined empirically, which control curve guarantees that, on the one hand, the substrate is coated very constantly and, on the other hand, the target is exploited optimally. The empirically determined control curve, for example for a gold target, can then repeatedly be used for the coating process. The control operation for the coating process can also be controlled by a program.

By means of the coils used in the present invention, a variable magnetic field may be generated very economically.

It is essential for the present invention that due to the use of magnetic coils, the magnetic field in the target space is controlled and varied purposefully so that the plasma can be displaced radially from inside to outside. The erosion groove can therefore be displaced radially over the target or can be changed; it is thus possible to produce, on the one hand, a very wide erosion groove by continuously varying the magnetic field or, on the other hand, two erosion grooves next to each other by stepwise switching the magnetic field back and forth.

Moreover, it is advantageous that at least a first coil or, for example, an annularly arranged coil is provided between the target or between the back surface of the target and the yoke plate.

In a further embodiment of the device according to the invention it is furthermore possible that at least one annularly arranged magnet is provided in the area of the yoke plate or in the area of the outer circumference of the yoke plate.

In a further embodiment of the invention it is advantageous that the first magnetic coil is provided in the area of the outer circumference of the target and the second magnetic coil is provided in the area of the cooling head.

According to a preferred embodiment of the solution according to the invention, the two magnetic coils are eventually provided slightly above the upper limit or the back surface of the target.

It is of particular importance for the present invention that the two magnetic coils are arranged in the same transverse plane.

In connection with the embodiment and arrangement of the invention it is advantageous that the two magnetic coils are arranged in the same transverse plane between a first or a second yoke plate and the back surface of the target.

Moreover, it is advantageous that the, for example annularly arranged magnet provided in the area of the outer circumference of the first and/or second yoke or yoke plate is provided between the lower or first yoke plate and the upper or second yoke plate.

In addition, it is advantageous that the two magnetic coils and the annularly arranged magnet are arranged concentrically with respect to the center axis of the sputtering cathode.

To this end it is advantageous that the annularly arranged magnet has an outer diameter which is approximately as large as, smaller or larger than the outer diameter of the first coil.

Moreover, it is advantageous that in an insulator provided between a target or at least one yoke plate and/or in the target ring chambers for receiving the coil or annularly arranged coils are provided.

In a further embodiment of the device according to the invention it is also possible that the two coils or annularly arranged coils have different diameters.

According to a further embodiment of the invention it is advantageous that the second annularly arranged coil has a smaller outer diameter than the first coil.

The arrangement according to the invention guarantees that the annularly arranged magnet has an N/S polarity directed towards the substrate.

In a further embodiment of the invention it is advantageous that a shielding means is provided between the two coils.

According to a further embodiment of the drive means of the present invention it is also possible that the shielding means is provided between one of the yoke plates and the target.

Moreover, it is advantageous that the shielding means is provided between one of the yoke plates and/or an insulator and the target.

An essential, advantageous embodiment is achieved in that the two yoke plates are spaced from each other with respect to the center axis.

Moreover, it is advantageous that the distance between the two yoke plates corresponds approximately to the height of the annularly arranged magnet.

Furthermore, it is advantageous that the two yoke plates have different outer diameters or that they are arranged In the form of a step.

According to a further development of the device according to the invention it is furthermore possible that the yoke plate having a smaller outer diameter is connected with the cooling finger and the yoke plate having a larger outer diameter is connected indirectly or directly with the pole shoe.

Preferably, sensors are provided for determining the coating thickness on the substrate, the shape of the target surface and/or the shape of the magnetic field.

To this end it is advantageous that the current fed to the coils can be varied depending on the time and/or the sensor signals.

Moreover, it is advantageous that the current fed to the coils or the current supply to the coils can be controlled via a control curve or a preset program and that for this purpose current conductors are in an operating connection with a computer via a current divider.

Advantageously, the sputtering energy can be set on the target depending on place and time so that a very constant coating and target exploitation can be achieved. Moreover, the coating process can be monitored and controlled during the process.

Further advantages and details of the invention are described in the claims and the description and shown in the Figures, in which FIG. 12a is a measuring arrangement for a cylinder-symmetric substrate, and FIG. 12b is a coating thickness (transmission) diagram of the measuring arrangement of FIG. 12a.

Figure 1:
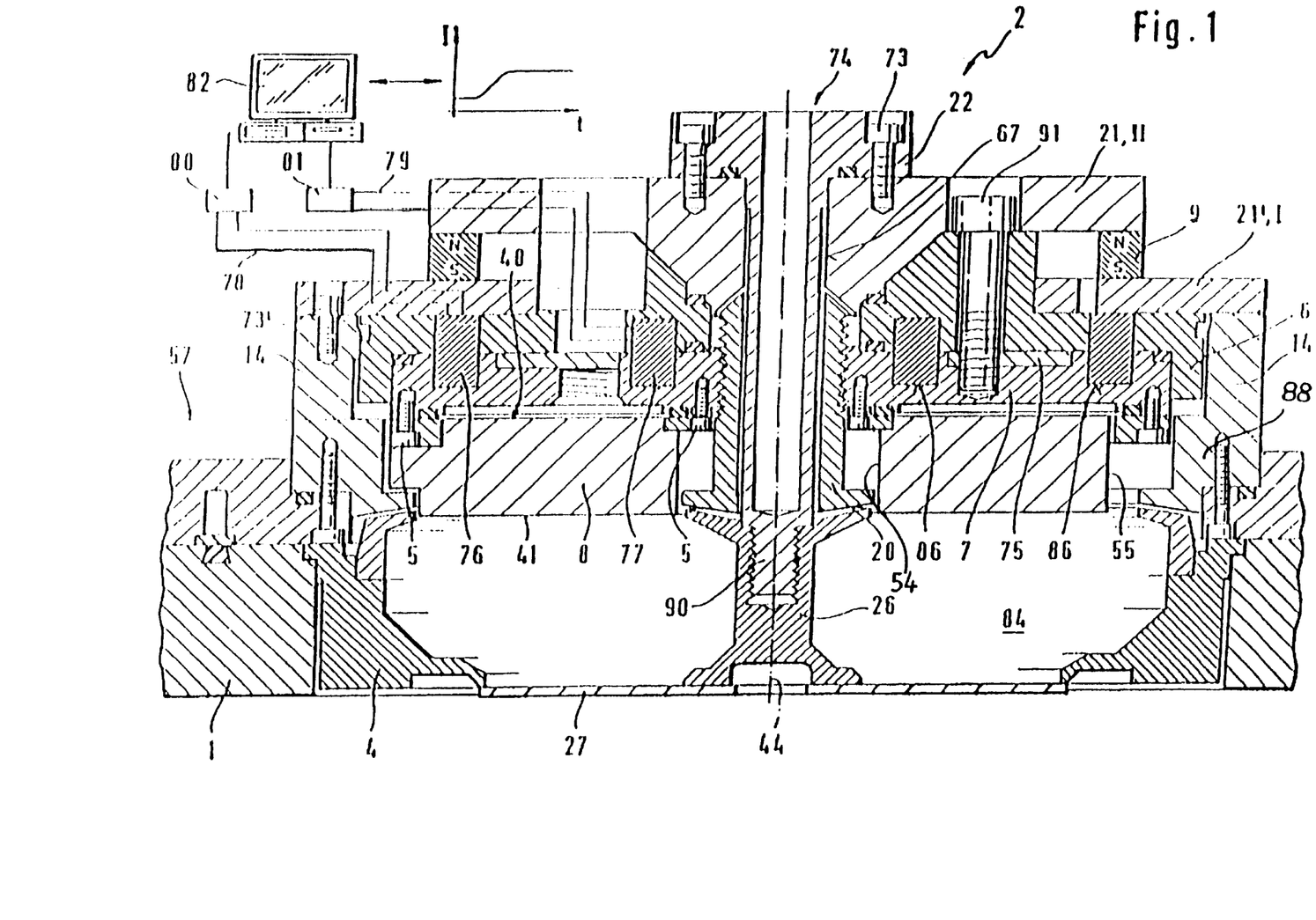
FIG. 1 is a cross-sectional view of a target with a plurality concentrically arranged coils and a ring of permanent magnets.

A cathode sputtering device for producing coatings on a substrate, e.g. a compact disk (CD) 27, is represented in FIG. 1. For performing the process, the sputtering cathode 2 can be installed in a chamber wall 1 of the cathode sputtering device. The cathode is composed of a disk-shaped ferromagnetic, first, lower yoke 21' (I) and a second or upper yoke 21 (II) spaced therefrom. The diameter of the first yoke 21' is larger than the diameter of the second yoke 21.

Figure 2:
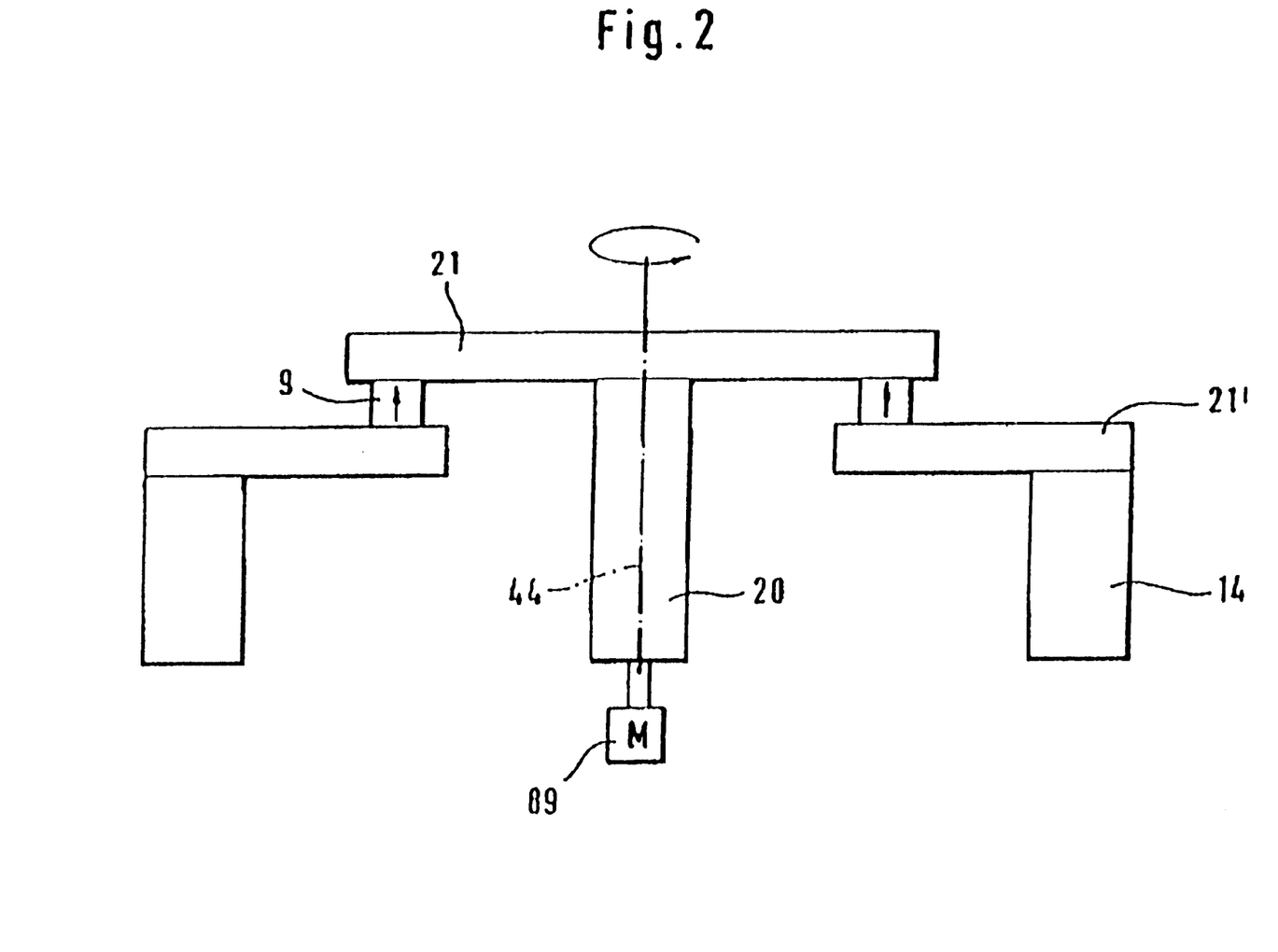
FIG. 2 is a schematic view of a stepped yoke.
Figure 3:
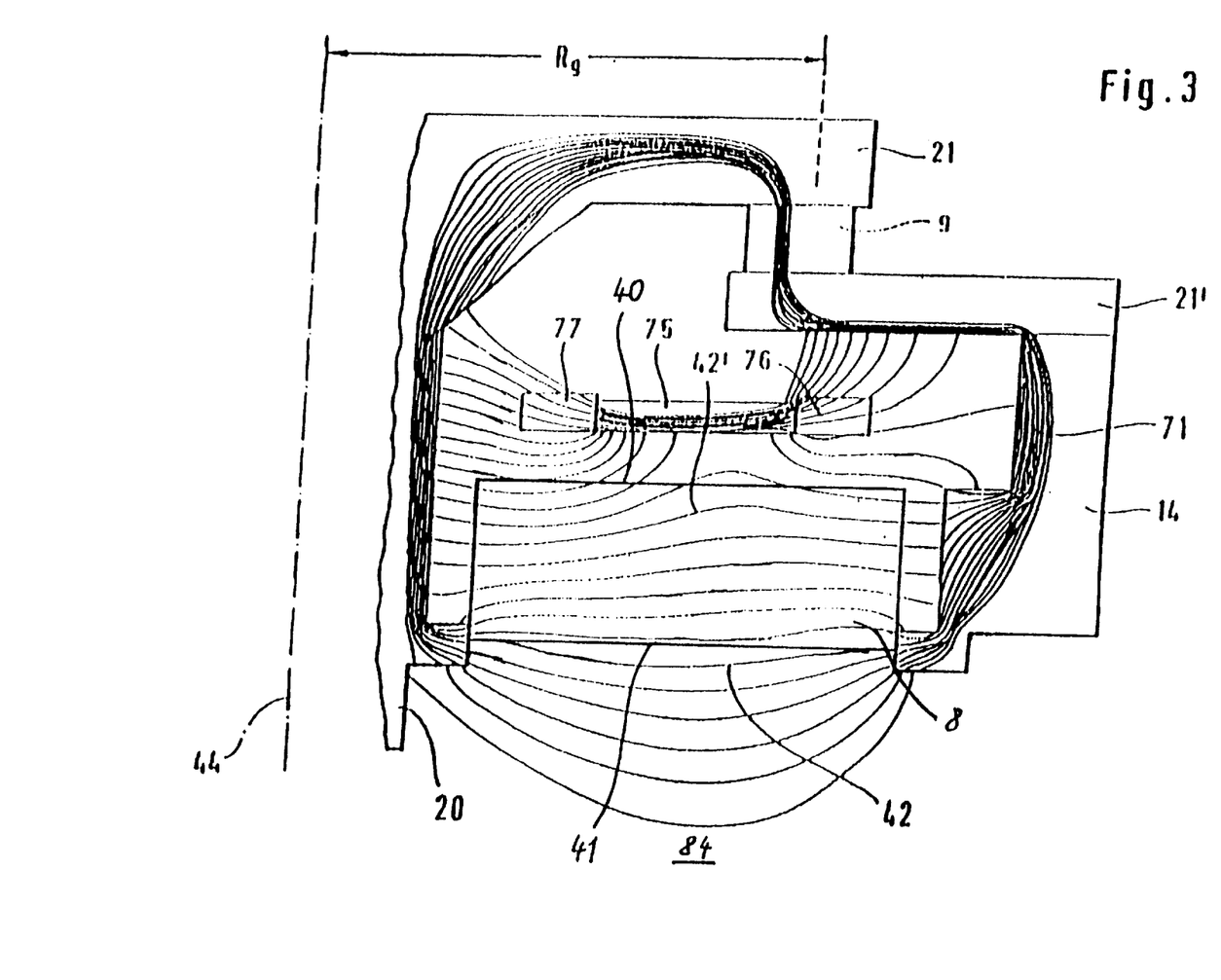
FIG. 3 is a schematic view of a pole shoe with the corresponding magnetic field lines.

As is evident from FIGS. 1, 2 and 3, the two yokes 21, 21' are arranged in the form of a step and axially symmetrically with respect to a longitudinal center axis 44 of the sputtering cathode 2, and they are sufficiently spaced from each other so that in this space an annularly arranged magnet 9 can also be arranged axially symmetrically with respect to the longitudinal center axis 44. This annularly arranged magnet 9 has an N/S polarity with respect to a target 8. The yokes 21, 21', the magnet 9 and the pole shoe 14 on the yoke 21' can be rotated around the longitudinal center axis 44 by means of a drive means 89.

The inner yoke plate 21 having a smaller outer diameter is connected indirectly or directly with a cooling finger 74, and the yoke plate 21' having a larger outer diameter is connected indirectly or directly with a pole shoe 14.

In FIG. 3, for example, a means generating a varying magnetic field or one or several magnetic coils 76, 77 is/are provided in the area of the yoke plates 21, 21'.

The two magnetic coils 76, 77 shown in FIG. 1 are arranged in the same transverse plane under the lower horizontal plane of the yoke plate 21'. The first magnetic coil 76 can be provided in the area of the outer circumference 55 of the target 8, and the second magnetic coil 77 can be provided in the area of the inner circumference 54 of the target 8 or in the area of the cooling finger or cooling head 74. The two magnetic coils 76, 77 are provided slightly above the upper limit 57 or the back surface 40 of the target 8. In this respect, it is advantageous that the magnet 9, which is annularly arranged and provided in the area of the outer circumference of the first and/or second yoke 21, 21', is provided between the upper or second yoke plate 21 and the lower or first yoke plate 21', and the two magnetic coils 76, 77 and the annularly arranged magnet 9 are arranged concentrically with respect to the center axis 44 of the sputtering cathode 2.

The sputtering cathode 2 further comprises a cooling plate 7. An insulator 6 is clamped between the yoke 21' and the cooling plate 7 and secured by means of threaded bolts 91.

The target 8 to be sputtered is provided in front of the cooling plate 7 and secured therein by means of bolts 5. One or two annular grooves 86 for receiving an inner and an outer magnetic coil 76, 77 are provided on the back surface of the cooling plate 7, said magnetic coils 76, 77 being arranged concentrically with respect to the center axis 44 of the target 8.

The yoke or the insulator 6 and the cooling plate 7 are secured by means of bolts 91 and the cooling finger 74. The insulator 6 advantageously insulates the bolt 91 or a bolt 73 against the yoke.

A power supply for generating the magnetic field may be connected to the magnetic coils 76, 77 via electric conductors 78, 79.

The magnet 9 is coupled to the yoke 21 and/or 21' and the pole shoe 14 for conducting the magnetic flux and thus forms the complete magnetic confinement.

The lower end of the pole shoe 14 forms a flange 88 to which the exterior mask or an anode 4 is connected. The height of the pole shoe 14 and/or the height of the anode 4 is variable.

The substrate 27, which encloses the target space 84 together with the anode 4 and the target surface 41, is provided at the lower end of the anode 4.

A bore 67 extending through the entire device and serving for receiving a hollow screw 20 and the cooling finger 74 is arranged in the area of the center axis 44 of the sputtering cathode 2. The cooling finger 74 can be connected with a cooling line which is not shown in the Figure.

With a yoke plate, the second yoke 21 adjoins the upper end of the hollow screw 20 in the axial direction without contacting the hollow screw 20.

The second yoke 21 (II) is connected to the upper end of the cooling head or cooling finger 74 by means of a flange 22, whereas the first yoke 21' (I) is connected to the pole shoe 14 and can be secured by means of bolts 73, 73'.

A center mask or center anode 26 is detachably connected to the front surface or the lower end of a thread portion 90 of the cooling finger 74. The center anode 26 extends into the centric recess of the target 8, said centric recess being provided at the front surface of the target and its lower end forms, together with the exterior anode 4 or exterior mask, a ring-shaped area for masking the substrate 27.

The distance between the annularly arranged magnet 9 and the center axis 44 is variable depending on the embodiment. In any case, the annularly arranged magnet 9 is provided between the center axis 44 and the pole shoe 14. As is evident from FIG. 1, a shielding means 75 can be provided between the two coils 76, 77. Moreover, it is possible that the shielding means 75 is provided between one of the yoke plates 21, 21' and the target 8. The shielding means 75 is, on the one hand, an iron core for the coils 76, 77 and increases their magnetic field, and, on the other hand, it shields the target space 84 against short circuit magnetic field lines of the magnet 9, so that a magnetic field variation can be effected with relatively low currents by means of the magnetic coils. For this purpose, the shielding means 75 can be provided between one of the yoke plates 21, 21' and/or the insulator 6 and the target 8. The magnet 9 serves for generating the magnetron magnetic field. According to FIG. 3, the field lines 71 of the cathode or the sputtering magnetron take, as field lines 42, a convex course over the target surface 41 and, as field lines 42', a flattened or approximately parallel course with respect to the back surface 40 of the target. This is advantageously also caused by the shielding means 75. Such an arrangement is particularly suitable in a non-ferromagnetic metal target, e.g. a gold or aluminum target.

The two magnetic coils 76, 77 are arranged slightly below the annularly arranged magnet 9. The annularly arranged magnet 9 can be formed of numerous single annularly arranged magnets. As is evident from FIG. 1, the outer, annularly arranged magnet has a larger distance from the back surface 40 of the target than the two magnetic coils 76, 77.

Depending on the realization of the target 8, which can be realized, for example, as an aluminum target or a gold target, in addition to the first annularly arranged magnet 9, at least one further annularly arranged magnet, which is not shown in the Figure, can be provided in the vicinity of the magnet 9 in order to increase the absolute field strength.

By means of the magnetic coils 76, 77 shown in FIG. 3, the main magnetic field can be varied, and these coils 76, 77 can have any desired polarity.

The current I fed to the coils 76, 77 can be varied depending on time. The current I fed to the coils 76, 77 or the current supply to the coils can be controlled via a control curve or a preset program in a computer 82, and, for this purpose, the current conductors 78, 79 are in an operating connection with a computer 82 via a current divider 80. Thus, the target surface 41 can be influenced purposefully throughout the entire sputtering process, and at the same time it is guaranteed that the coating produced on the substrate 27 has a constant thickness, wherein the thickness of the coating can deviate between ±2% to 3%. The required control curve can be determined empirically. Thus, for any corresponding target, e.g. a gold or aluminum target, a control curve being optimal for current supply can be determined. Moreover, the coating thickness on the substrate, the shape of the target surface and/or the shape of the magnetic fields can be monitored by means of sensors, and the power supply to the coils 76, 77 can be controlled accordingly.

It is particularly advantageous if the yoke is not integral, as already mentioned, but divided and consists of two individual parts, i.e. an upper and a lower yoke plate 21, 21', wherein these parts can consist of two axially symmetrical disks and be spaced from each other so that at least one magnet 9 can be provided between them.

Figure 4:
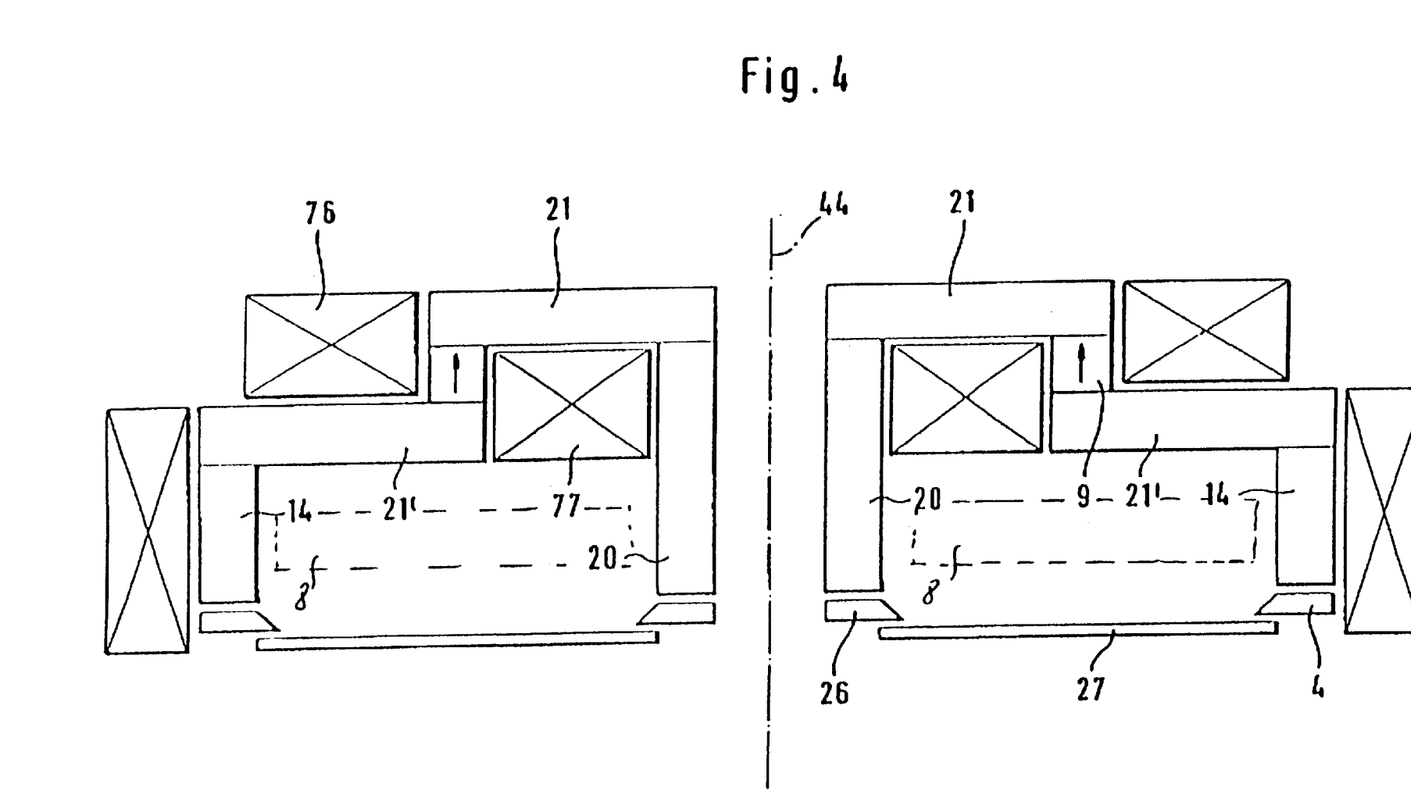
FIGS. 4–6 are three schematic views of a stepped yoke with different shielding means arrangements.
Figure 5:
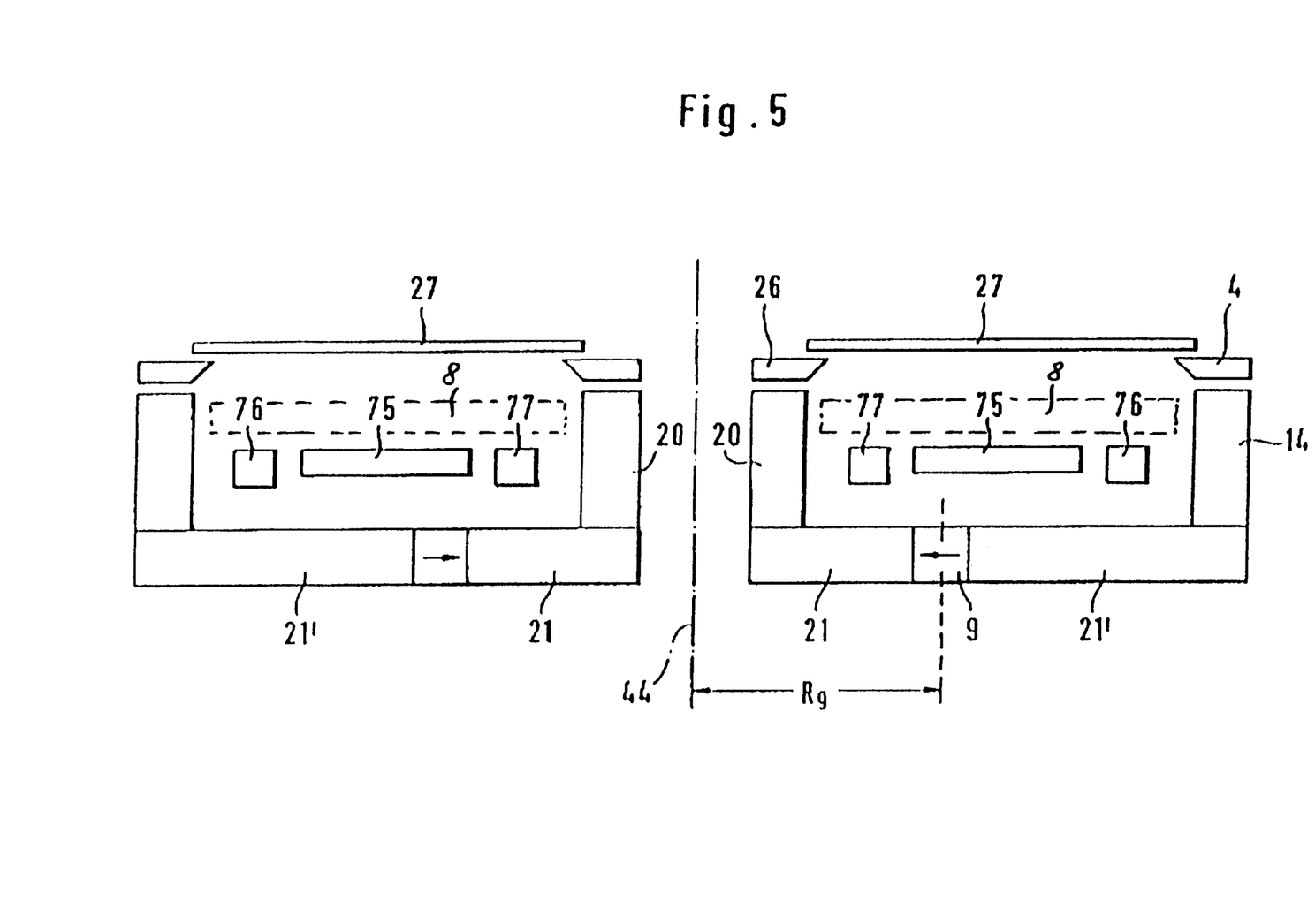

FIGS. 4 and 5 show further embodiments of the cathode sputtering device for producing coatings on a substrate 27, in which embodiments the coils 76, 77 or the yoke plates 21, 21' and the pole shoe 14 can also be realized or arranged in a way different from that of FIG. 1.

According to FIG. 4, the yoke plates 21, 21' are also realized like steps, wherein the inner edge of the upper yoke plate of FIG. 4 is connected with the hollow screw 20 and the outer edge is connected with the inner edge of the lower, stepped first yoke plate 21' via the annularly arranged magnet 9. The outer edge of the first yoke plate 21' is connected with the pole shoe 14. The first coil 76 having a larger diameter than the second coil 77 is located above the upper yoke plate 21 between the outer edge of the upper yoke plate 21 and the outer edge of the lower yoke plate, whereas the second coil 77 having a smaller diameter is located under the upper yoke plate 21 between the inner edge of the lower yoke plate 21' and the hollow screw 20. The remaining arrangement of this device corresponds to the arrangement of the device of FIG. 1.

Figure 6:
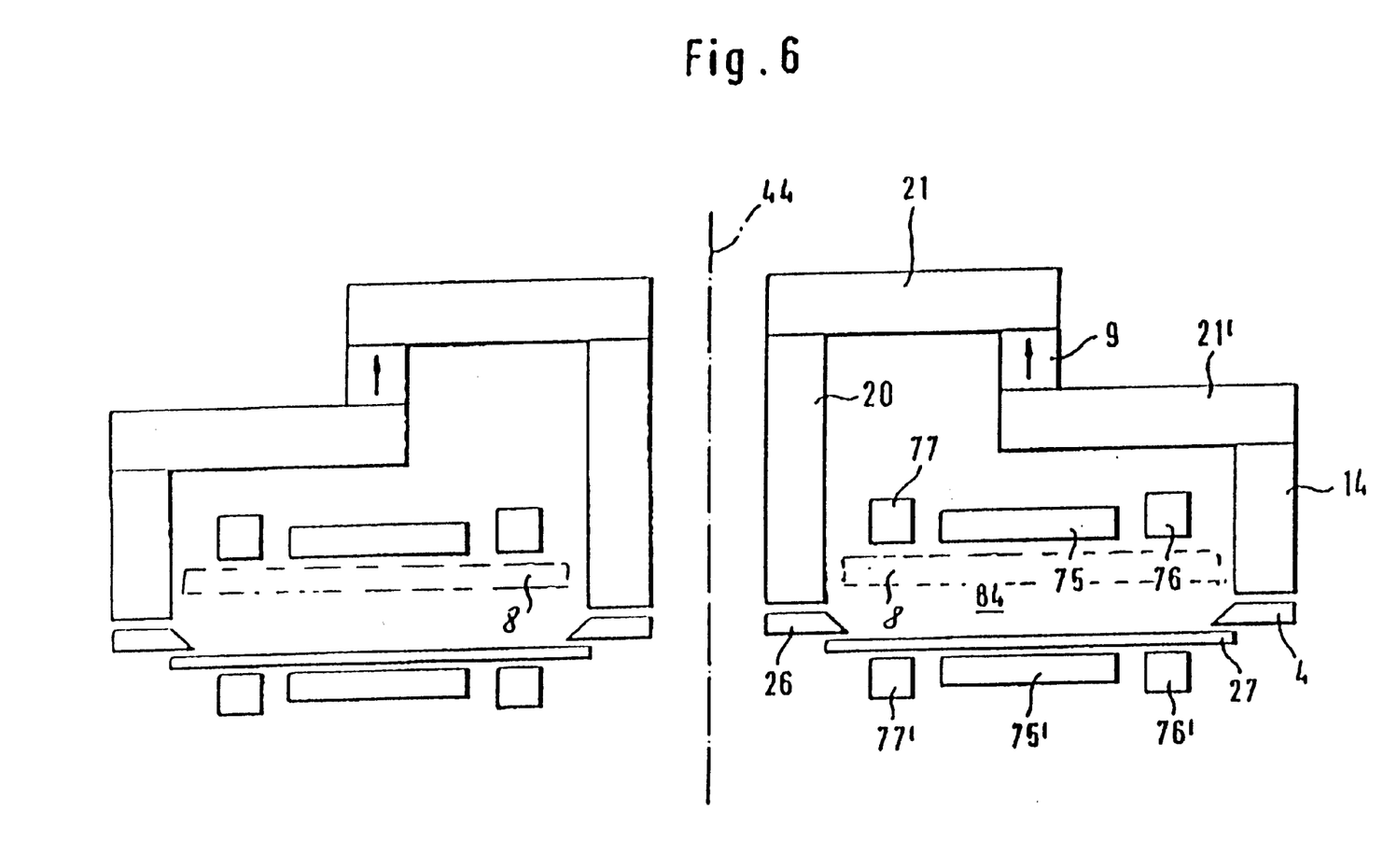

In FIG. 4 the coils 76, 77 are arranged at a greater distance from the target 8 than the coils of the examples according to FIGS. 1, 5 and 6. Thus, the coils of FIG. 4 must be larger and supplied with more current than the coils 76, 77 of the examples according to FIGS. 1, 5 and 6. According to FIG. 4, the plasma can be displaced as much as in the other embodiments, wherein the energy demand of FIG. 4 is slightly higher.

In the embodiment of FIG. 5, the yoke plates 21, 21' are also divided and they are also realized as ring-shaped yoke plates 21, 21' having different diameters, wherein both yoke plates are arranged in a plane which is horizontal with respect to the base of the device and intersects the center axis 44 at right angles. The ring magnet 9 is provided between the two yoke plates 21, 21'. The two annularly arranged coils 76, 77 surround the shielding means 75 and, according to FIG. 5, are located in the target space 84. In the embodiment according to FIG. 5 the yoke 21, 21' is divided radially with respect to the center axis 44. Thus, the magnet 9 can be arranged such that the magnetic flux can be distributed well among the hollow screw 20 and the pole shoe 14. Thus, a homogenous horizontal magnetic field can be obtained in the target space 84. As already mentioned, this magnetic field can controlled purposefully by the coils 76, 77. According to FIG. 5, the radius $R_9$ between the center axis 44 and the magnet 9 is variable or can be adjusted such that an optimum magnetic field 42 can develop.

The embodiment according to FIG. 6 differs from the embodiment according to FIG. 5 only in that a second shielding means 75' having two ring coils 76', 77' is located outside the target space 84 and arranged as in FIG. 5. The additional shielding plate 75 in the target space 84 or outside the target space 84 having the two coils 76, 77 or 76', 77' serves for purposefully and more optimally controlling the magnetic field. Thus, the lens shape of the magnetic flux lines (cf. magnetic field 42) is controlled.

The lens-shaped realization of the magnetic field 42 according to FIG. 3 leads to the confinement of the electrons on the target 8, which electrons serve for ionizing the effective gas atoms, e.g. argon atoms, in the sputtering chamber. The electrons are held above the target 8 by means of the magnetic field, and they can thus not flow to the anode. Therefore, the electrons can even take part in the ionization process several times. Thus, it is additionally guaranteed that a constant coating thickness is achieved on the surface of the substrate 27.

Due to the described arrangement and when taking into consideration the current-time-function ($f_{(t)}=I_{(t)}$), an optimum, constant coating thickness is achieved. As already mentioned, in this arrangement the current is varied in accordance with the target surface. By supplying different currents to the coils 76, 77, the plasma can be displaced radially above the target surface 41. This means that the plasma is displaced either to the left or right with respect to the surface of the target 8. Thus, the surface coating of the substrate 27 can be sputtered or grown well-directedly.

A stepped realization of the yoke plates 21, 21' allows a very simple, cost-efficient overall cathode design and also the use of a simple annularly arranged magnet, which can be realized, for example, as a square or rectangular magnet and not as a ring magnet and can easily be provided between the yoke plates 21 and 21'. Ring magnets are more complicated and thus more expensive than square or rectangular magnets.

The individual coils can be influenced to different extents and, according to the embodiment, can be coupled or not. For example, the coils 76, 77 of FIGS. 1 and 3 to 6 can be connected in series.

It is advantageous that by the use of the coils of FIGS. 1 and 3 to 6, which were arranged, as already described, under the target or at any other place, the magnetic field in the target space can be controlled and varied purposefully, so that the plasma can be displaced radially from inside to outside. It is therefore possible to displace the erosion groove radially over the target; thus, it is possible to produce on the one hand a very wide erosion groove by continuously varying the magnetic field or, on the other hand, two erosion grooves next to each other by stepwise switching the magnetic field back and forth.

A constant coating thickness can thus be achieved by adding (overlapping) a magnetic field varying with respect to time in the area of the cathode (target). This variable magnetic field serves for optimizing the coating thickness over a coating cycle. For this purpose, a current-time-function, which is to be defined empirically and serves for selecting the magnetic coils, is made.

The coils 76, 77 which, in accordance with FIGS. 5 and 6, are provided in the target space 84 mainly serve for controlling the magnetic field in the target space. For controlling the magnetic field outside the target space 84, according to FIG. 6 the additional coils 76', 77' and the shielding plate 75' are provided.

The present invention further provides a method for adjusting a constant coating thickness, an improved target utilization and conditioning of the target surface. The method is based on a position-dependent sputtering energy which can be adjusted on the target so that coating thickness non-homogeneities at the edges of the substrate, which are common in the prior art, can be avoided.

Figure 7:
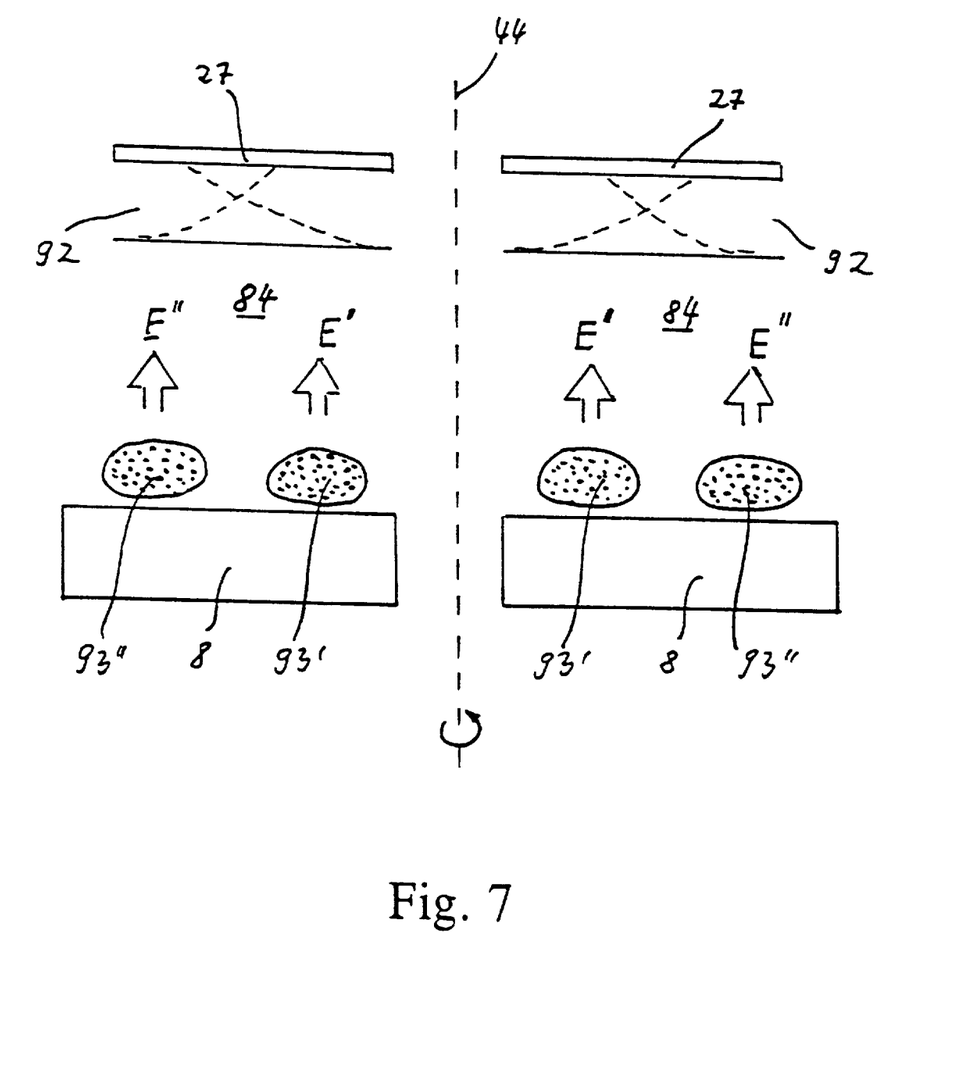
FIG. 7 is an arrangement for constantly coating a substrate.

FIG. 7 shows an arrangement in which, for example due to a suitable control of the magnetic coils 76 and 77 located on the back surface of the target, an inner plasma ring 93' and an outer plasma ring 93" are arranged on the target 8 at two specific positions. The plasma rings 93' and 93" have a specific sputtering energy E' and E", respectively. The different deposition rates of the coating 92 on the substrate 27, which are caused by the different sputtering energies, the coating depositions being shown in broken lines, produce, when being overlapped, a constant thickness of the coating 92. During the deposition of the coating 92, the substrate or the target can rotate around the center axis 44. As shown in FIG. 7, the plasma can be arranged at two or more stationary positions above the target (i.e. on the surface facing the substrate 27). Moreover, it is possible to continuously move or wobble the plasma over the target. in this connection, the sputtering performance can be controlled in accordance with the position of the plasma by adjusting the cathode current and cathode voltage. According to the invention, a plasma ring being concentrical with respect to the center axis 44 can be moved over the target 8 by varying its radius.

Figure 8:
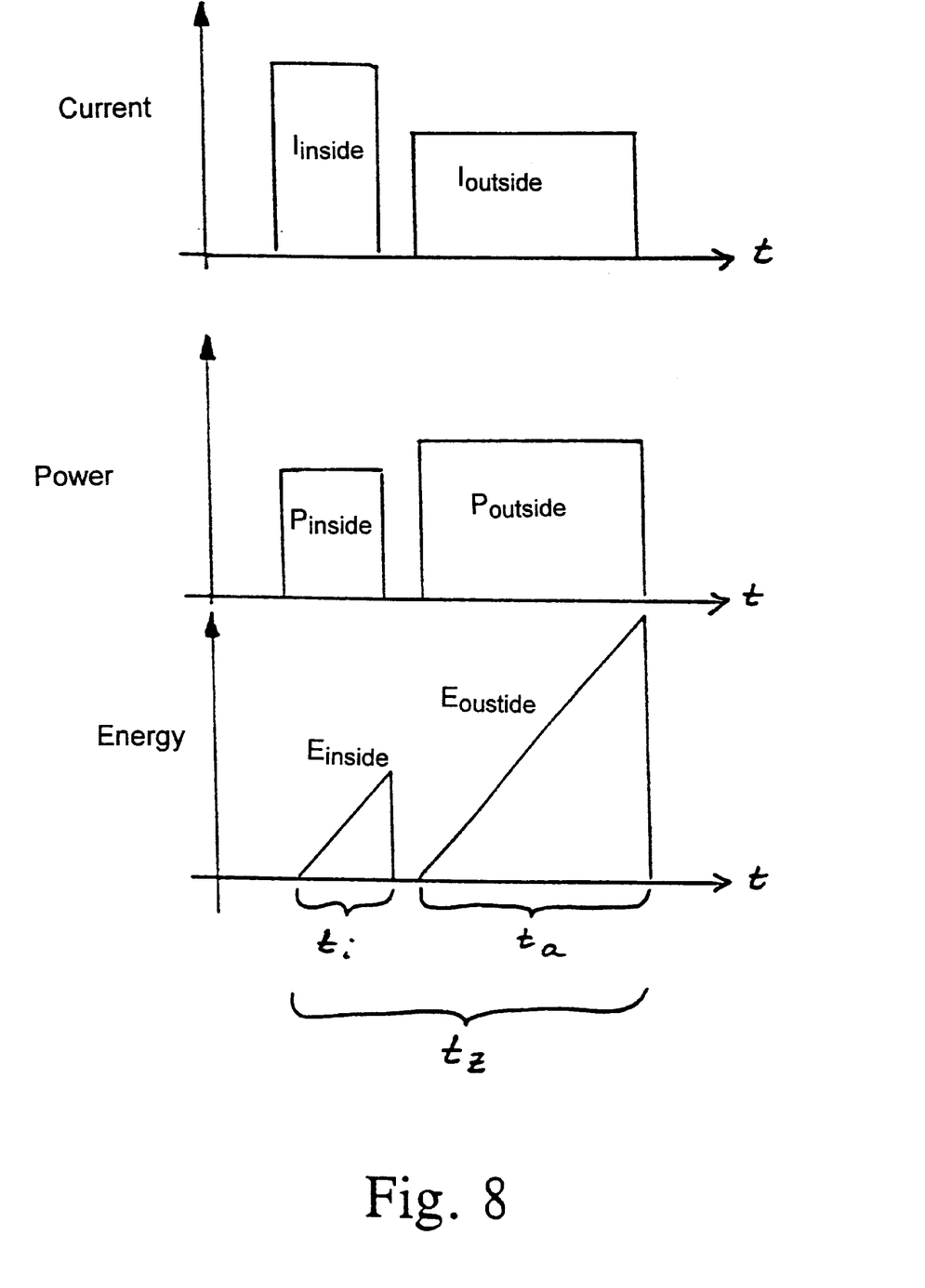
FIG. 8 is a current, power and energy diagram for a sputtering process with two discrete sputtering positions.

The arrangement of FIG. 7 is explained in more detail in FIG. 8. Above the time axes (abscissas) of FIG. 8, the excitation currents of an inner and an outer magnetic coil (e.g. coils 76 and 77 of FIG. 1) are shown in the diagram on the top, the sputtering performances on an inner and an outer position of the target are shown in the diagram in the middle, and the resulting sputtering energies on an inner and an outer position of the target are shown in the diagram on the bottom. During the time period $t_z$ of a coating cycle, first the inner coil is excited by the current $I_{inside}$ during the time period $t_i$ and an inner plasma ring is produced. At the same time, the sputtering performance $P_{inside}$, which leads to an increase in the sputtering energy $E_{inside}$ over the time period $t_i$, is adjusted at the inner target position by the voltage between cathode and anode. After the time period $t_i$ has passed, the inner magnetic coil is switched off and the outer magnetic coil is excited during the time period $t_a$, and an outer plasma ring is produced. At the same time, the sputtering performance $P_{outside}$, which leads to an increase in the sputtering energy $E_{outside}$ over the time period $t_a$, is adjusted at the outer plasma position by the voltage between cathode and anode. After switching off the outer magnetic coil, the coating cycle is finished.

Figure 9:
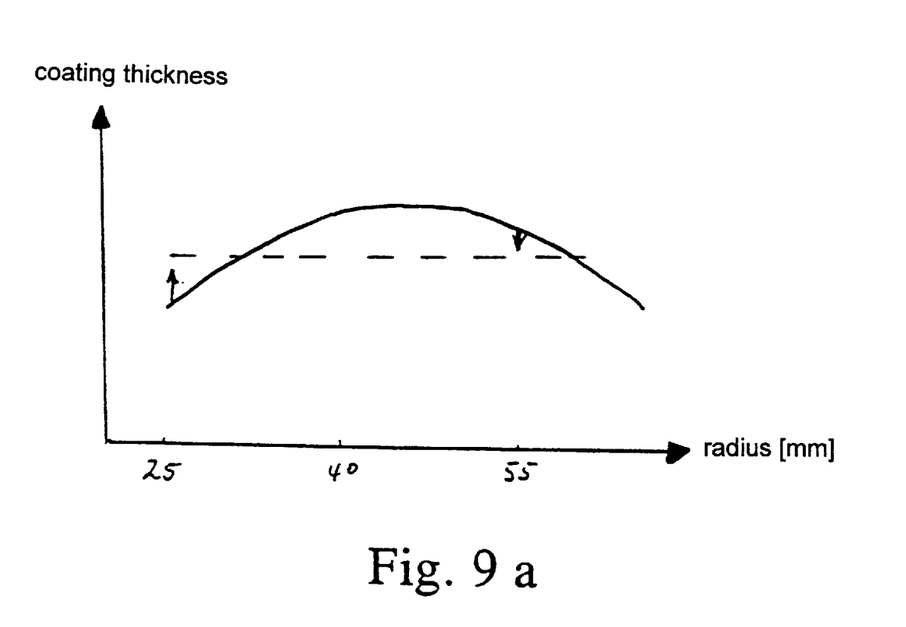
FIG. 9a is the coating thickness distribution on a substrate before control.
FIG. 9b is the coating thickness distribution on a substrate after control.

The influence of the position-dependent sputtering energy, which is present on the target 8, on the coating thickness is evident from the comparison of FIGS. 9a and 9b. In the Figures, the thickness of the coating 92 is deposited on the substrate from inside to outside in the direction of the radius. Without the method of the invention, a coating thickness dependence as shown in FIG. 9a is achieved. By the method of the invention the coating thickness can be homogenized to a large extent, as is shown in FIG. 9b.

The inventive method of the position-dependent sputtering energy has also a very favorable influence on the target efficiency and the conditioning of the target surface.

Figure 10:
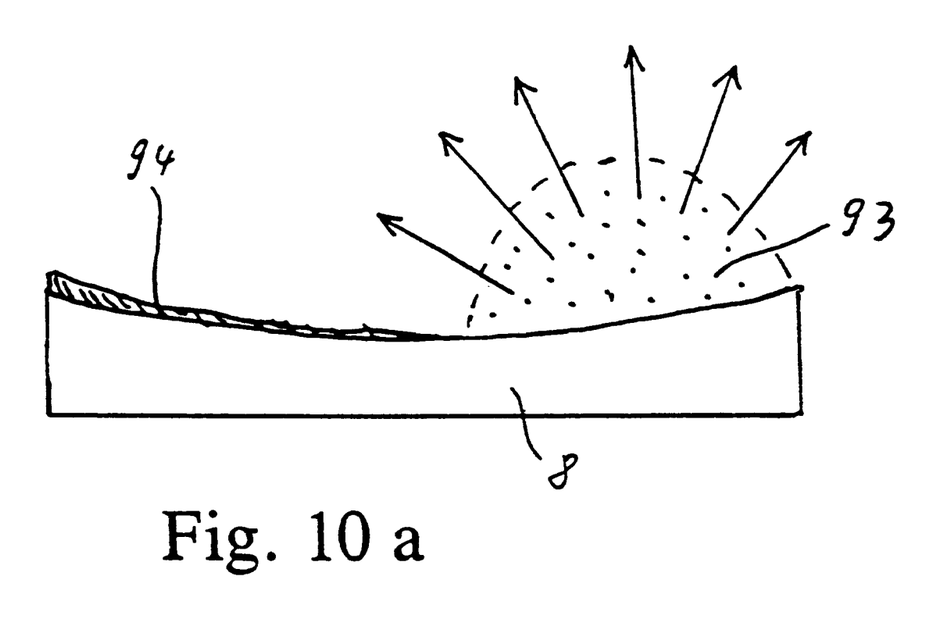
FIG. 10a is the sputtering of a target with stationary plasma.
FIG. 10b is the sputtering of a target with moving plasma.

FIG. 10a shows that with a low sputtering energy a back-coating can be produced at the edge of a target. In this connection, undesired grain-like structures can occur.

FIG. 10b shows that if the plasma 92 moves over the target 8 in accordance with the invention, a back- or reverse-coating at the edge is avoided.

In particular, a back-coating on the target can be avoided by adjusting the sputtering amount in one process cycle at least as great as the back-coating amount. In this connection, the reactivity of the sputtering process depends on the power density at the target surface. In case of the same sputtering power, the power density is greater on a smaller target surface than on a larger target surface. If the power density is too high, the process becomes metallic, i.e. only the metallic target is sputtered, so that reactive sputtering does not take place. Thus, the power density must be adapted to the corresponding target surface. In accordance with the invention, this is done by suitably controlling the magnetic coils and a suitable cathode/anode voltage adjustment. The method of the invention allows a very constant coating thickness even with a small target-substrate distance and with thick targets.

Figure 11:
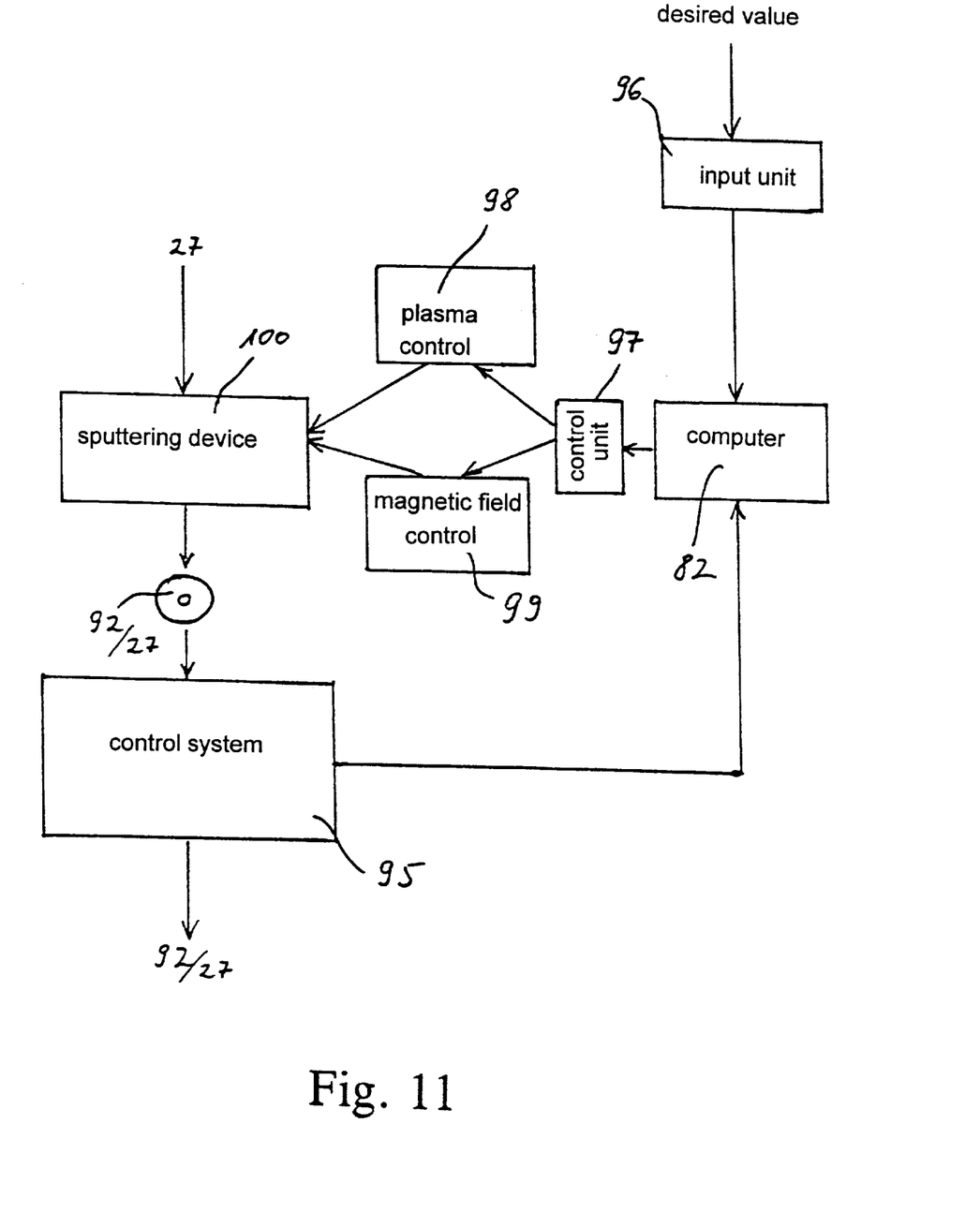
FIG. 11 is the control loop for the coating process.

FIG. 11 shows a control loop by means of which, in accordance with the invention and by measuring the substrate and its coating, the process parameters for the following coating cycle(s) can be adjusted in order to control the coating thickness and to make sure that a constant coating thickness is achieved.

After application of a coating 92, a substrate 27 is supplied to a control system 95 measuring the coating thickness or the coating thickness distribution. The result is supplied to a computer 82 which compares this value with a desired value, which can be input, for example, by an operator via the input unit 96. If measured value and desired value do not agree, the computer calculates a correction value for the coating thickness. The correction value is supplied to a control unit 97 controlling the plasma current supply 98 and the magnetic field deflection 99 in order to readjust the coating thickness at the next substrate 27 to be coated in the sputtering device 100.

Figure 12:
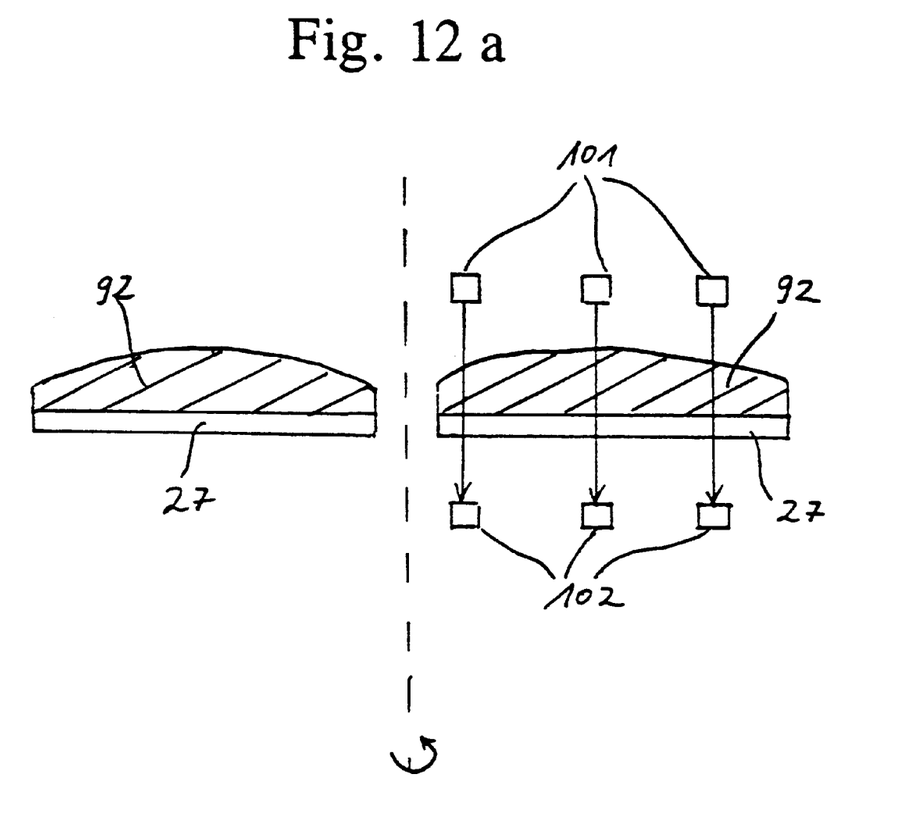

FIG. 12a shows an example of a measuring arrangement for determining the coating thickness of cylinder-symmetric substrates. Three or more photo-diodes 101 are arranged above the coating 92. Three or more photo sensors 102 assigned to the photo-diodes are arranged below the substrate 27. The coating thickness can then be determined on the basis of the measured light transmission being inversely proportional to the thickness of the coating 92 at a constant substrate thickness.

Corresponding transmission values concerning the radius, which represent the coating thickness, are shown in FIG. 12b. For taking the mean of erratic values (error ranges are schematically indicated as vertical error bars), the coated substrate is rotated around the center axis 44 during the measurement.

The measurement can also take place in reflection.

It is possible that the coating thickness is measured during the coating process and that the coating thickness is controlled during the coating process.

The method according to the invention is advantageous in that the coating, the target efficiency and the target conditioning can be adapted continuously.

What is claimed is:

1. A method for coating substrates by magnetron cathode sputtering by means of a sputtering cathode arranged in a vacuum chamber and comprising pole shoes, a target and a magnetic field proximate a surface of the target, wherein the magnetic field is generated in that a variable magnetic field superimposes a static magnetic field, wherein
    (a) the variable magnetic field is generated by coils between a back surface of the target and at least one yoke plate,
    (b) the static magnetic field is generated by at least one annularly arranged magnet proximate the yoke plate,
    (c) a target space between the target and the substrate is shielded against short circuit field lines of the static magnetic field by means of an iron core between the coils, and
    (d) the variable magnetic field is increased by the iron core.

2. The method according to claim 1, wherein the magnetic field is varied during the coating process.

3. The method according to claim 1, wherein the magnetic field is varied between two coating cycles.

4. The method according to claim 1, wherein the variable magnetic field is controlled in accordance with a preset course.

5. The method according to claim 1 using sensors for determining a coating thickness on the substrate, a shape of the target surface and/or a shape of the magnetic field, wherein the magnetic field is controlled in accordance with output signals from the sensors.

6. The method according to claim 1, wherein the coating is controlled by adjusting a position-dependent sputtering energy (E', E") on the target.

7. The method according to claim 6, wherein a sputtering power of the cathode is controlled depending on a position of plasma produced by the cathode.

8. The method according to claim 7, wherein the plasma is adjusted to at least one position opposite the target.

9. The method according to claim 8, wherein the positioning of the plasma is performed by the magnetic coils.

10. The method according to claim 7, wherein the plasma is moved continuously over the target.

11. The method according to claim 6, wherein an inner plasma ring and an outer plasma ring are arranged opposite the target.

12. The method according to claim 10, characterized in that a plasma ring being concentrical with respect to a center axis is moved over the target by varying a radius of the plasma ring.

13. A method according to claim 1, wherein coating parameters are measured during the coating process and subsequently the coating parameters are controlled.

14. A method according to claim 1 wherein coating parameters are measured after the coating of a substrate is finished and that in a subsequent coating process the process parameters are adjusted on the basis of the measured coating parameters.

15. The method according to claim 14 comprising
  (e) measuring the coating parameters,
  (f) supplying the measured coating parameters to computing unit,
  (g) calculating correction values for the coating on the basis of preset desired values, and
  (h) controlling the coating on the basis of the correction values.

16. The method according to claim 15, the measuring includes calculating an average while the substrate rotates around a center axis.

17. A device for coating substrates by magnetron cathode sputtering comprising:
  (a) a sputtering cathode arranged in a vacuum chamber, pole shoes and a target,
  (b) an arrangement for generating a continuously variable magnetic field proximate a surface of the target, wherein
  (c) the arrangement comprises at least one magnet for generating a static magnetic field and first and second magnetic coils for generating a continuously variable magnetic field superimposing the static magnetic field,
  (d) the magnetic coils are provided between a back surface of the target and at least one yoke plate,
  (e) said at least one magnet for generating a static magnetic field, annularly arranged, is provided in the area of the at least one yoke plate or in the area of the outer circumference of the at least one yoke plate, and
  (f) an iron core is provided between the two coils.

18. The device according to claim 17 further including sensors for determining a coating thickness on a substrate, a shape of the target surface and/or a shape of the resultant combined magnetic field.

19. The device according to claim 17, wherein the first magnetic coil is provided proximate an outer circumference of the target and the second magnetic coil is provided proximate an inner circumference of the target.

20. The device according to claim 19, wherein the first and second magnetic coils are provided above an upper limit of the target.

21. The device according to claim 19, wherein the first and the second magnetic coil are arranged in the same transverse plane.

22. The device according to anyone of claim 19, wherein the first and the second magnetic coil are arranged in the same transverse plane between a first or second yoke plate and the back surface of the target.

23. The device according to claim 17, wherein the annularly arranged magnet provided proximate an outer circumference of the yoke plate is arranged between a lower or first yoke plate and an upper or second yoke plate.

24. The device according to claim 17, wherein the two magnetic coils and the annularly arranged magnet are arranged concentrically with respect to a center axis of the sputtering cathode.

25. The device according to claim 17, wherein the annularly arranged magnet has an outer diameter which is about as large as, smaller or larger than an outer diameter of the first coil.

26. The device according to claim 17, wherein ring chambers for receiving coils are provided in an insulator, which is provided between the target and at least one yoke plate.

27. The device according to claim 17, wherein the magnetic coils have different diameters.

28. The device according to claim 27, wherein the second magnetic coil has a smaller outer diameter than the first magnetic coil.

29. The device according to claim 17, wherein the at least one magnet has an N/S polarity directed towards a substrate.

30. The device according to claim 17, wherein the iron core is provided between one of the yoke plates and the target.

31. The device according to claim 17, wherein the iron core is provided between one of the yoke plates or an insulator and the target.

32. The device according to claim 17, wherein the at least one yoke plate further comprises two yoke plates are spaced from each other in a direction of a center axis.

33. The device according to claim 32, wherein the distance between the two yoke plates corresponds to approximately a height of the at least one magnet.

34. The device according to claim 32, wherein the two yoke plates have different outer diameters or are arranged in the form of a step.

35. The device according to claim 33, wherein a first of the two yoke plates having a smaller outer diameter is connected with a cooling finger and a second of the two yoke plates having a larger outer diameter is connected indirectly or directly with the pole shoes.

36. The device according to claim 17, wherein a current fed to the coils can be varied depending on time.

37. The device according to claim 17, wherein a current fed to the coils or a current supply to the coils can be controlled via a control curve or a preset program and that for this purpose current conductors are in an operating connection with a computer via a current divider.

38. The device according to claim 17, wherein said at least one yoke plate comprises two yoke plates and wherein a first magnetic coil is arranged above a first one of said two yoke plates and a second magnetic coil is arranged below a second one of said two yoke plates.

39. The device according to claim 17, wherein a second iron core and two second ring-shaped magnetic coils are arranged outside a target space between the target and substrates.

40. The device according to claim 39, wherein the second iron core and the second magnetic coils are arranged mirror-symmetrically with respect to the iron core and the magnetic coils below the substrate.

* * * * *